United States Patent
Choi et al.

(10) Patent No.: US 8,563,951 B2
(45) Date of Patent: Oct. 22, 2013

(54) EXPOSURE SYSTEMS FOR INTEGRATED CIRCUIT FABRICATION

(75) Inventors: Jin Choi, Yongin-si (KR); Jin-Ha Jeong, Yongin-si (KR); Vladimir Urazaev, Suwon-si (KR); Hea-Yun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/419,761

(22) Filed: Mar. 14, 2012

(65) Prior Publication Data

US 2012/0292535 A1 Nov. 22, 2012

(30) Foreign Application Priority Data

May 18, 2011 (KR) .................. 10-2011-0046577

(51) Int. Cl.
*G21K 5/04* (2006.01)
(52) U.S. Cl.
USPC ............... 250/492.22; 250/396 R; 250/492.1; 250/492.2; 250/492.21; 250/492.23
(58) Field of Classification Search
USPC ............... 250/396 R, 492.1, 492.2, 492.21, 250/492.22, 492.23, 492.3
See application file for complete search history.

(56) References Cited

U.S. PATENT DOCUMENTS

| | | | | |
|---|---|---|---|---|
| 4,899,060 A | * | 2/1990 | Lischke | ............... 250/505.1 |
| 5,065,034 A | * | 11/1991 | Kawanami et al. | ........ 250/505.1 |
| 5,886,357 A | * | 3/1999 | Kojima | ............... 250/492.23 |
| 5,978,138 A | | 11/1999 | Kang et al. | |
| 6,960,414 B2 | | 11/2005 | Park et al. | |
| 7,463,333 B2 | | 12/2008 | Park et al. | |
| 7,518,704 B2 | | 4/2009 | Kim et al. | |
| 7,525,110 B2 | * | 4/2009 | Suzuki et al. | ............ 250/492.22 |
| 7,629,087 B2 | | 12/2009 | Huh et al. | |
| 7,714,308 B2 | | 5/2010 | Hiroshima | |
| 2002/0162088 A1 | * | 10/2002 | Inanami et al. | ................ 716/19 |

(Continued)

FOREIGN PATENT DOCUMENTS

| | | |
|---|---|---|
| JP | 2008-066441 | 3/2008 |
| KR | 10-2009-0072790 A | 7/2009 |
| KR | 10-2009-0102069 A | 9/2009 |

OTHER PUBLICATIONS

"Piezoelectrics in Positioning"—Tutorial on Piezotechnology in Nanopositioning Applications; Moving the NanoWorld; www.pi.ws; © Physik Instrumente (PI) GmbH & Co. KG 2008; 47 Pages (2-171)-(2-217).

(Continued)

*Primary Examiner* — Michael Logie
(74) *Attorney, Agent, or Firm* — Myers Bigel Sibley & Sajovec, P.A.

(57) ABSTRACT

Exposure systems include a beam generator, which is configured to irradiate source beams in a direction of an object to be exposed by the source beams, along with first and second beam shapers. The first beam shaper, which is disposed proximate the beam generator, has a first aperture therein positioned to pass through the source beams received from the beam generator. The second beam shaper is disposed proximate the first beam shaper. The second beam shaper includes a plate having a second aperture therein, which is positioned to receive the source beams that are passed through the first aperture of the first beam shaper. The second beam shaper further includes a first actuator and a first shift screen mechanically coupled to the first actuator.

15 Claims, 17 Drawing Sheets

(56) References Cited

U.S. PATENT DOCUMENTS

| | | | |
|---|---|---|---|
| 2007/0114453 A1* | 5/2007 | Emi et al. | 250/492.2 |
| 2007/0257207 A1* | 11/2007 | Frosien et al. | 250/492.3 |
| 2008/0054196 A1* | 3/2008 | Hiroshima | 250/492.23 |
| 2010/0072403 A1* | 3/2010 | Abe et al. | 250/492.22 |
| 2010/0086104 A1* | 4/2010 | Michaelsen et al. | 378/71 |

OTHER PUBLICATIONS

Sahouria et al., "Generalization of shot definition for variable shaped e-beam machines for write time reduction"; Mentor Graphics Corp.; Photomask Technology 2012; Proc. of SPIE vol. 7823, 78230T; © 2010 SPIE; Downloaded from SPIE Digital Library on Apr. 17, 2011; 6 pages.

* cited by examiner

EXPOSURE SYSTEMS FOR INTEGRATED CIRCUIT FABRICATION

REFERENCE TO PRIORITY APPLICATION

This application claims priority under 35 U.S.C. §119 to Korean Patent Application No. 10-2011-0046577, filed May 18, 2011, the disclosure of which is hereby incorporated herein by reference.

FIELD

The present invention relates to exposure systems and, more particularly, to exposure systems for integrated circuit fabrication.

BACKGROUND

The increase in integration density of semiconductor devices has led to the decrease of design rules. Thus, a photomask pattern to be transferred to a wafer may be formed in various shapes in order to meet these decreased design rules. Photomask patterns may be generated using exposure systems. Examples of exposure systems are disclosed by commonly assigned U.S. Pat. Nos. 7,629,087 to Huh et al., 7,518,704 to Kim et al., 7,463,333 to Park et al., 6,960,414 to Park et al. and 5,978,138 to Kang et al., the disclosures of which are hereby incorporated herein by reference.

SUMMARY

Exposure systems for integrated circuit fabrication include a beam generator, which is configured to irradiate source beams in a direction of an object to be exposed by the source beams, along with first and second beam shapers. The first beam shaper, which is disposed proximate the beam generator, has a first aperture therein positioned to pass through the source beams received from the beam generator. The second beam shaper is disposed proximate the first beam shaper. The second beam shaper includes a plate having a second aperture therein, which is positioned to receive the source beams that are passed through the first aperture of the first beam shaper. The second beam shaper further includes a first actuator and a first shift screen mechanically coupled to the first actuator. The first shift screen is configured to at least partially block the second aperture from receiving the source beams from the first beam shaper in response to movement of the first actuator.

According to additional embodiments of the invention, the second aperture has a rectangular shape and the first shift screen is configured to move back and forth along a line parallel to a diagonal of the second aperture, in response to back and forth movement of the first actuator. This first shift screen may have a polygonal shape with at least one right-angled corner. According to additional embodiments of the invention, a second actuator may also be provided, which is mechanically coupled to the plate. The second actuator is configured to move the plate in a direction orthogonal to the movement of the first actuator. According to still further embodiments of the invention, a second polygonal-shaped shift screen is provided, which is mechanically coupled to the first shift screen. Movement of the first actuator in a first direction may cause the first shift screen to move in the first direction towards the second aperture and may cause the second shift screen to move in the first direction away from the second aperture. This second shift screen may have a polygonal shape with at least one right-angled corner.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
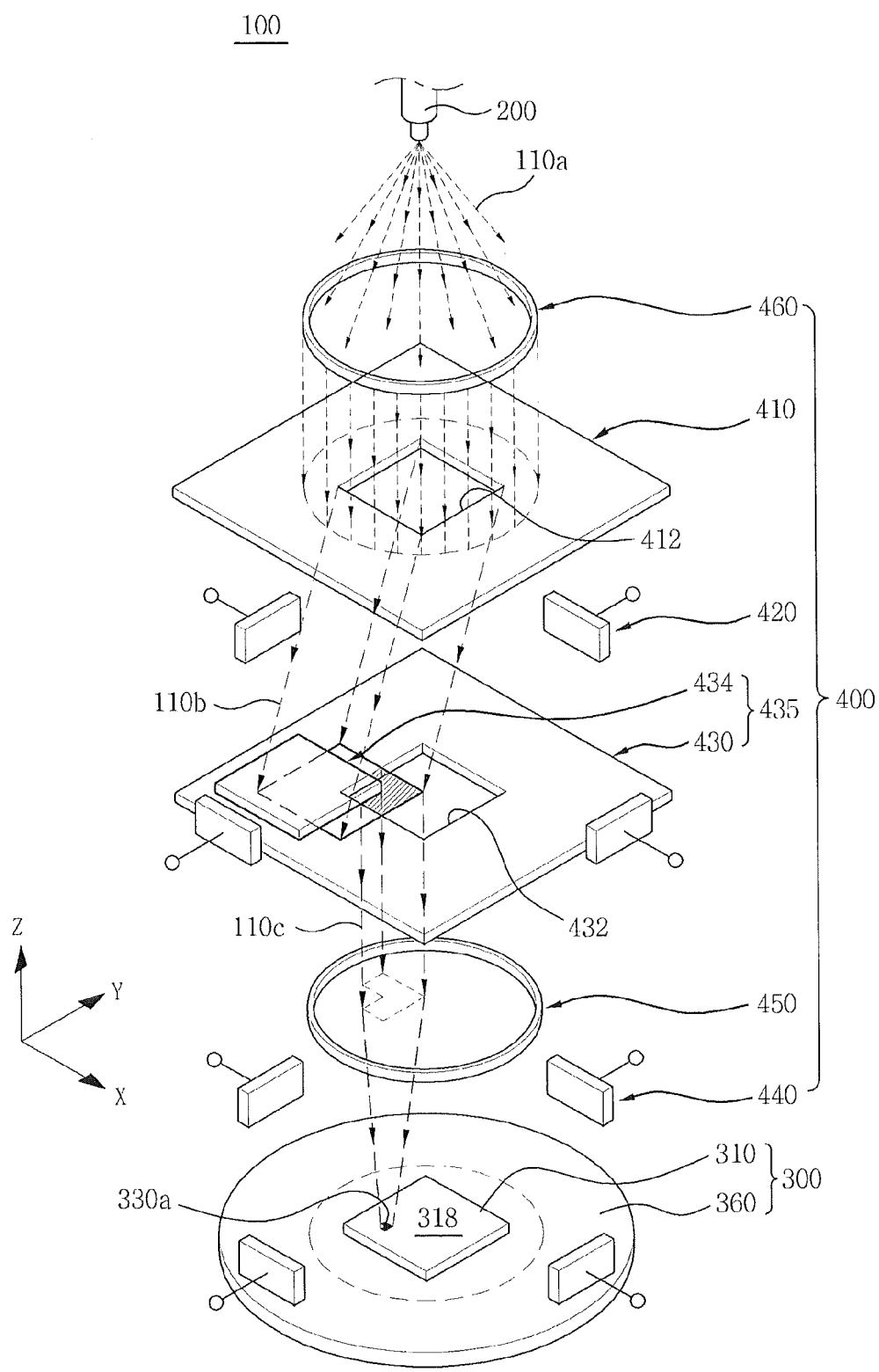
FIG. 1A is a schematic perspective view of an exposure system according to embodiments of the inventive concept.

Various example embodiments will now be described more fully with reference to the accompanying drawings in which some example embodiments are shown. The inventive concept may, however, be embodied in different forms and should not be construed as limited to the embodiments set forth herein. Rather, these embodiments are provided so that this disclosure is thorough and complete and will full convey the scope of the inventive concept to one skilled in the art. In the drawings, the thicknesses of layers and regions may be exaggerated for clarity. Like numbers refer to like elements throughout.

Figure 1B:
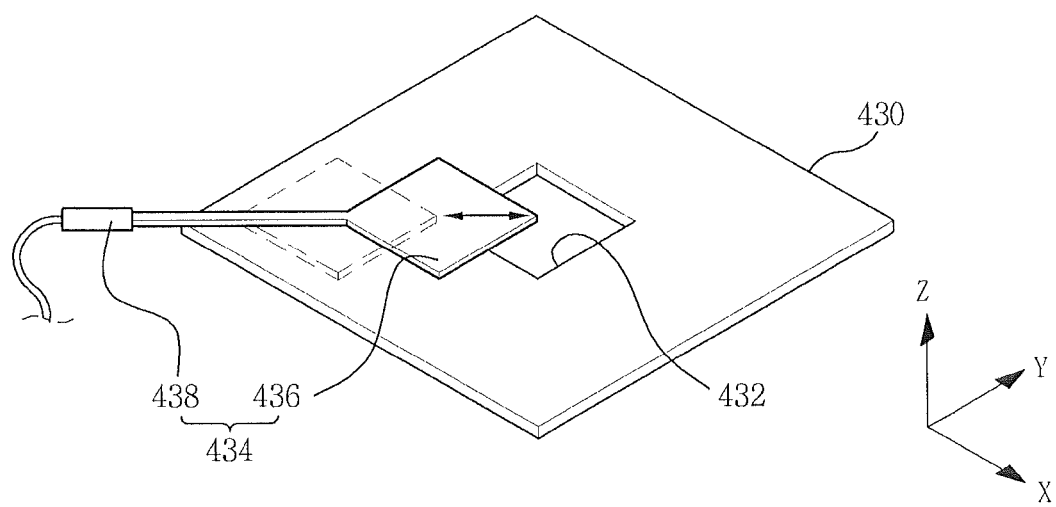
FIG. 1B is an enlarged perspective view of some components of FIG. 1A.

FIG. 1A is a perspective view of an exposure system 100 according to embodiments of the inventive concept, and FIG. 1B is an enlarged perspective view of a subsidiary beam shaper of FIG. 1A. Referring to FIG. 1A, the exposure system 100 may include a beam generator 200 configured to provide source beams 110a, an exposure stage 300 on which an exposure operation is performed using the source beams 110a, and a light shaping unit 400 configured to shape the source beams 110a into a predetermined shape and size. The exposure system 100 may be a variable-shaped-electron-beam (VSB)-type system. The source beams 110a provided by the beam generator 200 may be shaped by the light shaping unit 400 and irradiated to the exposure stage 300. For example, the source beams 110a may be sequentially shaped into first shaped beams 110b and second shaped beams 110c by the light shaping unit 400. In some embodiments, the source beams 110a may be electron beams (e-beams). In this case, the beam generator 200 may be an e-beam gun configured to irradiate e-beams. In other embodiments, the source beams 110a may include ion beams, extreme ultraviolet (UV) beams, or proximity X-ray beams. The exposure stage 300 may include a base 310 having a photoresist material thereon that is exposed to the beams and a base stage 360 on which the base 310 is mounted. The base stage 360 may move forward, backward, leftward, or rightward. When an exposure process is performed using the exposure system 100 according to the inventive concept, a photoresist layer 318 may be coated on the base 310.

Figure 2A:
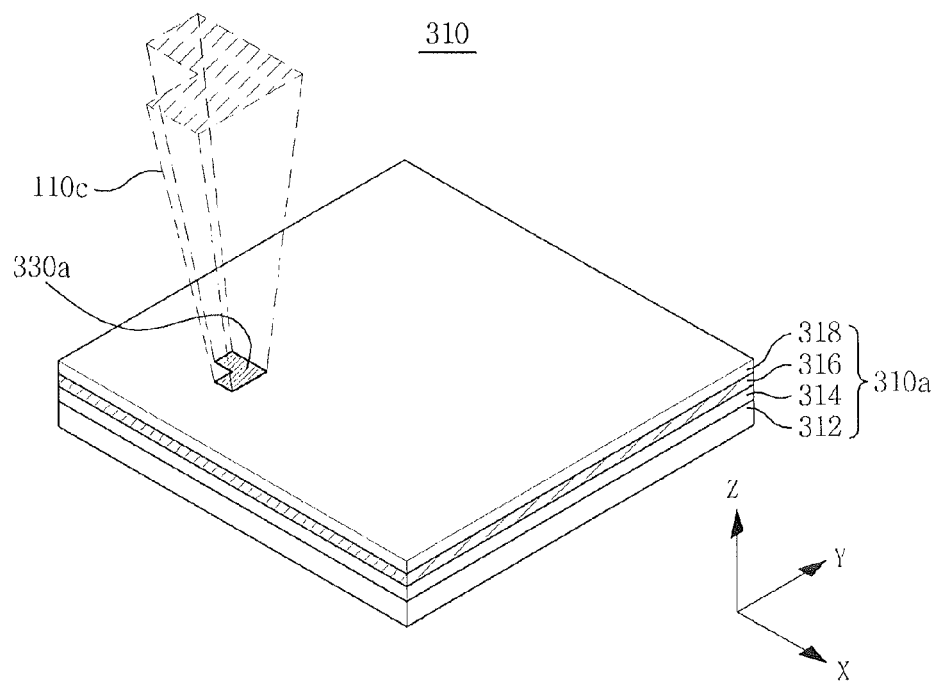
FIGS. 2A and 2B are perspective views of a photomask and a wafer, respectively, manufactured using an exposure system according to embodiments of the inventive concept.

FIG. 2A is a perspective view of a photomask manufactured using an exposure system according to embodiments of the inventive concept. Referring to FIG. 2A, a base 310 may include a blank photomask 310a coated with a photoresist material. The blank photomask 310a may include a blank photomask required for manufacturing a phase-shift mask (PSM). The blank photomask 310a may include a transparent substrate 312, a shift layer 314 formed on the transparent substrate 312, a light shielding layer 316 formed on the shift layer 314 and a photoresist layer 318 formed on the light shielding layer 316. The transparent substrate 312 may include a transparent material such as quartz. The shift layer 314 may include a semitransparent material, such as molybdenum silicon nitride (MoSiN), molybdenum silicon carbon nitride (MoSiCN), molybdenum silicon oxynitride (MoSiON), or molybdenum silicon carbon oxynitride (MoSiCON). The light shielding layer 316 may include a generally opaque material, such as chromium (Cr), chromium carbide (CrC), chromium nitride (CrN), or chromium carbon nitride (CrCN). The photoresist layer 318 may include a positive photoresist material or a negative photoresist material. More specifically, the photoresist layer 318 may be an e-beam resist layer. In other embodiments, the blank photomask 310a may include a photomask from which the shift layer 314 is omitted to manufacture a binary photomask. An exposure pattern 330a of FIG. 2A may be formed using second shaped beams 110c formed using the exposure system 100 according to the inventive concept. In applied embodiments, the exposure pattern 330a may refer to a region obtained by exposing the photoresist layer 318 to the second shaped beams 110c.

Figure 2B:
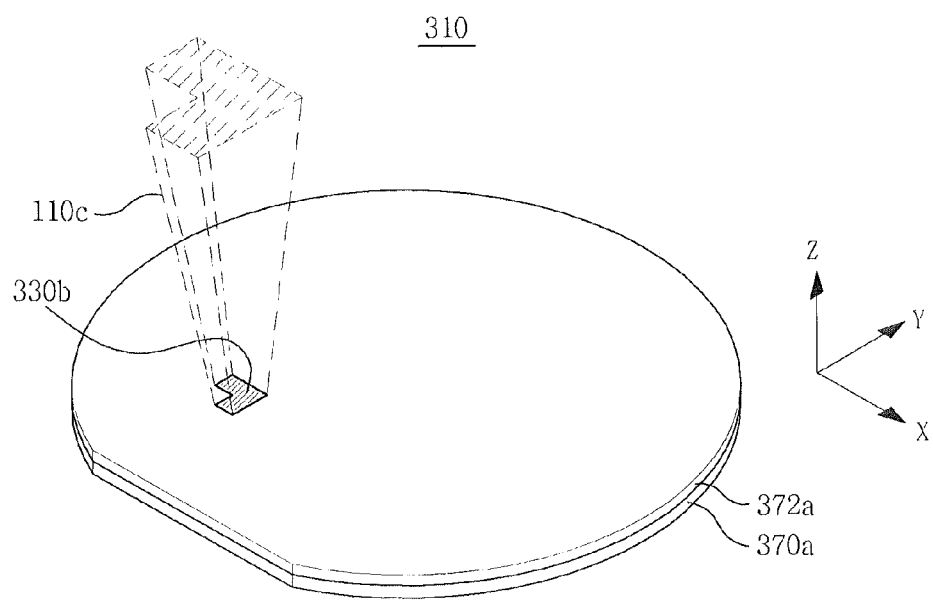

FIG. 2B is a perspective view of a semiconductor device manufactured using an exposure system 100 according to additional embodiments of the inventive concept. Referring to FIG. 2B, a base 310 may include a wafer 370a having a top surface coated with a photoresist layer 372a to manufacture a semiconductor device. As in FIG. 2A, a region of the photoresist layer 372a irradiated with second shaped beams 110c may be defined as an exposure pattern 330b.

Referring again to FIG. 1A, a light shaping unit 400 may include a plurality of spaced-apart beam shapers 410 and 435 configured to variously shape cross-sections of source beams 110a or first shaped beams 110b, and a plurality of deflectors 420 and 440 configured to change or focus paths of the first shaped beams 110b or the second shaped beams 110c. The beam shapers 410 and 435 may include apertures 412 and 432 configured to control the quantity of the source beams 110a or the first shaped beams 110b. Each of the deflectors 420 and 440 may include a magnetic lens configured to control the direction of the first shaped beams 110b or the second shaped beams 110c.

The light shaping unit 400 may include a first beam shaper 410 configured to shape the source beams 110a into first shaped beams 110b, a first deflector 420 configured to deflect the first shaped beams 110b to a predetermined position, a second beam shaper 435 configured to shape the first shaped beams 110b into second shaped beams 110c, and a second deflector 440 configured to deflect the second shaped beams 110c to a predetermined position. An object deflector 450 may also be provided between the second beam shaper 435 and the base 310. The object deflector 450 may compress the second shaped beams 110c and pass the compressed second shaped beams 110c to the base 310. A condenser lens 460 configured to reduce the loss of the source beams 110a may be provided between the beam generator 200 and the first beam shaper 410.

Referring still to FIG. 1A, the first beam shaper 410 may include a first aperture 412 configured to shape the source beams 110a. The first beam shaper 410 may include a silicon plate. While passing through the first aperture 412 of the first beam shaper 410, the source beams 110a may be shaped into first shaped beams 110b having a predetermined first shape. The second beam shaper 435 may include a plate 430 and a subsidiary beam shaper 434. The plate 430 may include a second aperture 432. The plate 430 may be a silicon plate. As shown by FIG. 1B, the subsidiary beam shaper 434 may include a shift screen 436 and a first actuator 438 configured to drive the shift screen 436. The shift screen 436 may have a polygonal shape with at least one right-angled corner. In the present embodiment, the shift screen 436 may have a tetragonal shape. The shift screen 436 may be controlled by the first actuator 438 to overlap a portion of the second aperture 432. That is, the shift screen 436 may be controlled to cover a portion of the second aperture 432.

The first shaped beams 110b may be shaped into second shaped beams 110c by the second beam shaper 435. A plane surface of the second shaped beam 110c into which the first shaped beam 110b is shaped by the second beam shaper 435 may depend on the shape in which the shift screen 436 overlaps the second aperture 432. For example, the second aperture 432 may be covered with the shift screen 436 so that e-beams may be shaped into an L shape. Accordingly, since the second aperture 432 is covered with the shift screen 436, the second beam shaper 435 may shape e-beams into an L shape.

By moving the first and second beam shapers 410 and 435 in the x- and y-axial directions of FIG. 1A, the first and second shaped beams 110b and 110c may be deflected in the x-axial direction or the y-axial direction. In another case, the first and second shaped beams 110b and 110c may be deflected by the first and second deflectors 420 and 440 in the x-axial direction or the y-axial direction. For example, the first deflector 420 may include a magnetic lens that operates to deflect the first shaped beam 110b in the x-axial direction or the y-axial direction in response to an electric signal. Accordingly, even if the first and second beam shapers 410 and 430 are fixed in position, the first shaped beam 110b may be shaped by the first deflector 420. In addition, the second shaped beam 110c may be transferred by the second deflector 440 and irradiated onto a target exposure region of the photoresist layer 318.

The position of the base 300 may also be controlled due to a motion of the base stage 360 so that the second shaped beam 110c can be irradiated onto the desired target exposure region of the photoresist layer 318. Moreover, while operating the base stage 360 and the second deflector 440 at the same time, the second shaped beam 110c may be irradiated onto the desired target exposure region of the photoresist layer 318. For example, the base stage 360 may be reciprocated in the x-axial direction, while the second deflector 440 may reciprocated in the y-axial direction.

Figure 3A:
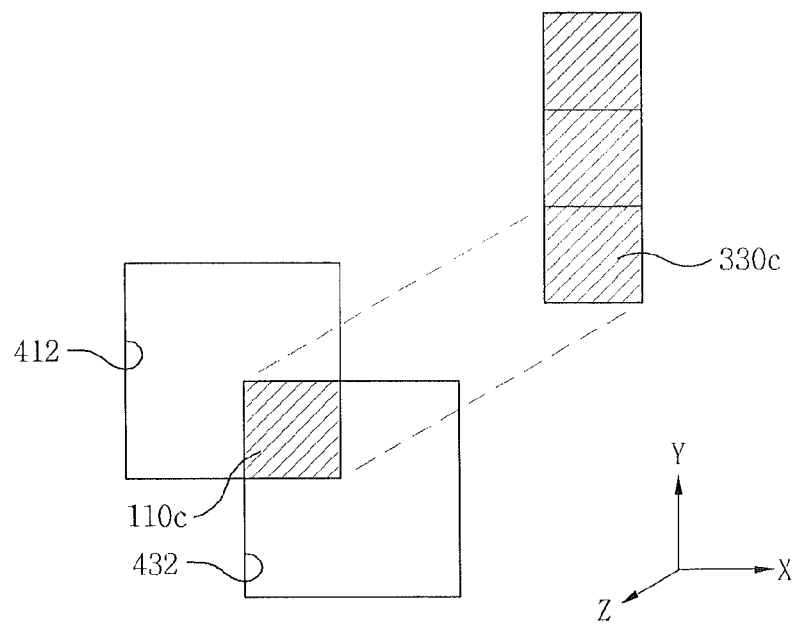
FIGS. 3A and 3B are plan views of various shapes in which apertures overlap according to embodiments of the inventive concept.
Figure 3B:
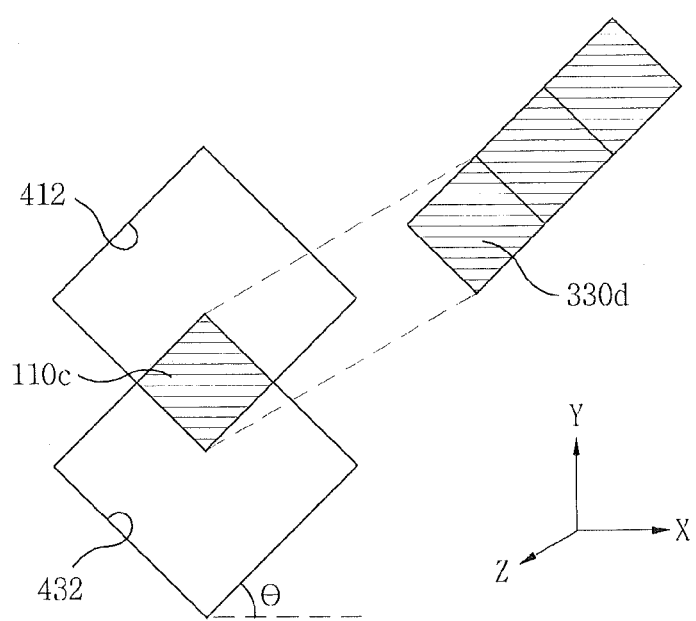

FIGS. 3A and 3B are plan views of various shapes in which apertures overlap according to embodiments of the inventive concept. Referring to FIG. 3A, each of first and second apertures 412 and 432 may have a regular tetragonal shape. The first and second apertures 412 and 432 may overlap each other in a tetragonal shape. Accordingly, a source beam 110a passing through the first and second apertures 412 and 432 may be shaped into a second shaped beam 110c having a tetragonal shape. For example, when a line-shaped pattern is formed, an exposure pattern 330c may be formed using a combination of the above-described second shaped beam 110c having the tetragonal shape.

In another case, referring to FIG. 3B, since the first and second apertures 412 and 432 overlap each other in a diagonal direction, the first and second apertures 412 and 432 may overlap each other in a diamond shape. Accordingly, a source beam 110a passing through the first and second apertures 412 and 432 may be, shaped into a second shaped beam 110c having a diamond shape. Thus, by rotating each of the first and second beam shapers 410 and 430 by an angle of θ, the first and second apertures 412 and 432 may overlap each other in a diamond shape. For example, a line-shaped pattern may be formed in a diagonal direction by sequentially exposing an exposure pattern 330d to the above-described diamond-shaped second shaped beam 110c.

Figure 4A:
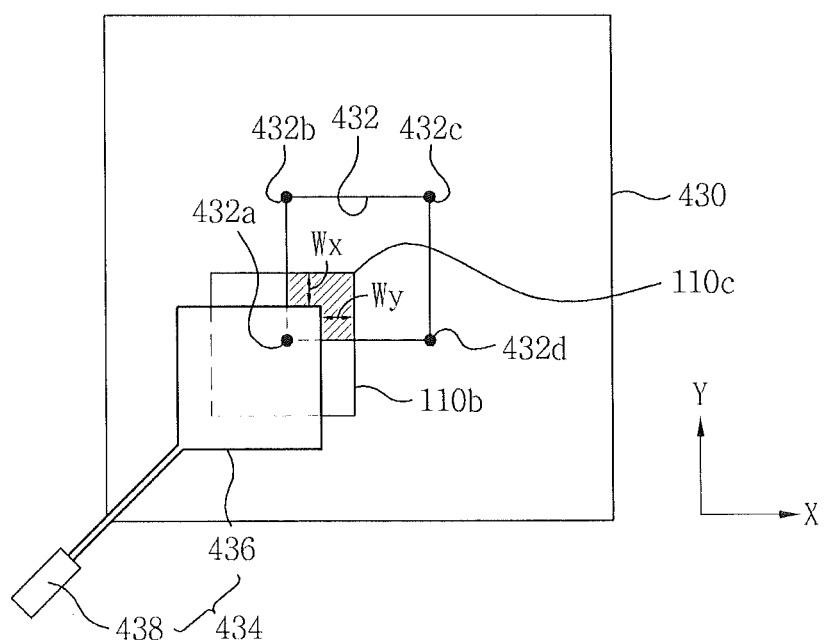
FIGS. 4A through 4F are plan views showing various combinations and operation states of a second beam shaper and a shift screen according to embodiments of the inventive concept.

FIGS. 4A through 4F are plan views of second beam shapers according to additional embodiments of the inventive concept. Referring to FIGS. 1A, 1B, and 4A, a second beam shaper 435 may include a plate 430 having a second aperture 432 and a subsidiary beam shaper 434. The subsidiary beam shaper 434 may include a shift screen 436 and a first actuator 438 configured to drive the shift screen 436. The subsidiary beam shaper 434 may be provided on any one of two opposite surfaces of the plate 430. In one example, the shift screen 436 may be installed on a top surface or bottom surface of the plate 430. The shift screen 436 may move and partially cover the second aperture 432. The second aperture 432 may have four right-angled corners 432a, 432b, 432c, and 432d. The shift screen 436 may slide in a horizontal direction on the plate 430 disposed adjacent to any one of the corners 432a to 432d of the second aperture 432 and directly cover the second aperture 432. When the subsidiary beam shaper 434 is installed on the plate 430, an additional space for installing the subsidiary beam shaper 434 may not be required. If the subsidiary beam shaper 434 is installed on or under the plate 430 in addition to the plate 430, the entire length of the exposure system 100 may be increased, thereby precluding precise control of e-beams. Also, when the subsidiary beam shaper 434 is installed on a top or bottom surface of the plate 430, an additional magnetic lens may not be required to control the direction of e-beams shaped by the subsidiary beam shaper 434. As a result, the number of components may be reduced, and the second beam shaper 435 may have the capability of accurately shaping irradiating beams.

Figure 4B:
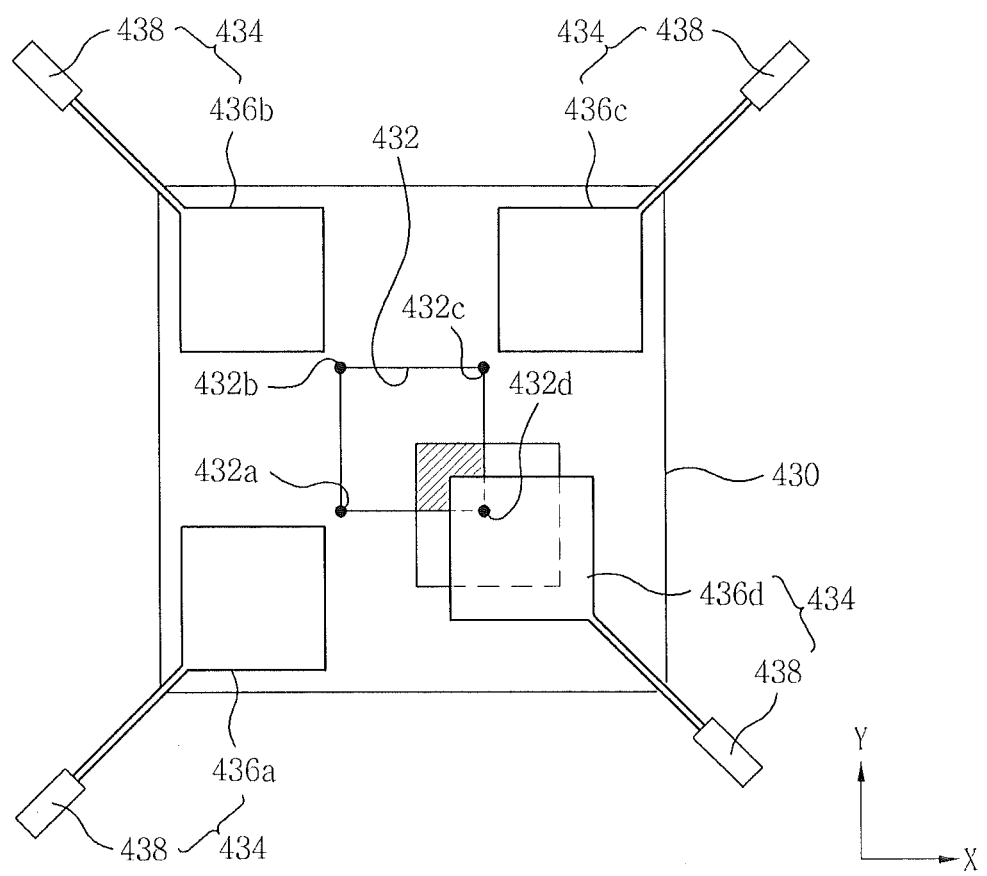

According to another embodiment illustrated by FIG. 4B, a shift screen 436 may include first through fourth screens 436a to 436d corresponding to first through fourth corners 432a to 432d of a second aperture 432, respectively. Meanwhile, a first actuator 438 may include a piezoelectric element, which may be expanded or compressed in a lengthwise direction thereof. Accordingly, the shift screen 436 connected to the first actuator 438 may be moved back and forth along an axis of the actuator. The piezoelectric member may include a material such as lead-zirconate-titanate (PZT). For example, the piezoelectric member may include PZT (Pb(Zr, Ti)O$_3$) or PLZT ((Pb, La)(Zr, Ti)O$_3$). When no voltage is applied to the first actuator 438, the piezoelectric element may not be changed, which means the shift screen 436 connected to the piezoelectric element may remain in a fixed position. However, when a predetermined voltage is applied to the first actuator 438, a predetermined displacement of the piezoelectric element in a lengthwise direction may occur, and the shift screen 436 connected to the piezoelectric element may be moved. Since the displacement is proportional to the applied voltage, the displacement may be controlled by adjusting the applied voltage. By using the piezoelectric element within the first actuator 438, the drive of the shift screen 436 may be linearly controlled in the lengthwise direction. Thus, as shown by FIGS. 4A and 4B, a first actuator 438 may be installed at a corner of the plate 430 and transfer the shift screen 436 in a diagonal direction (for example, at an angle of about 45°) relative to an x-axial direction (or y-axial direction).

Figure 4C:
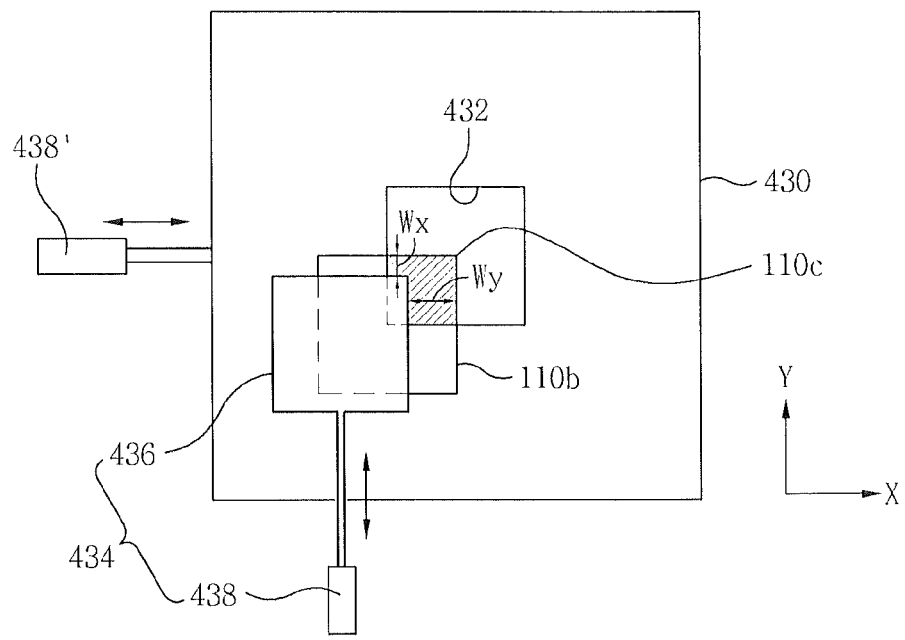
Figure 4D:
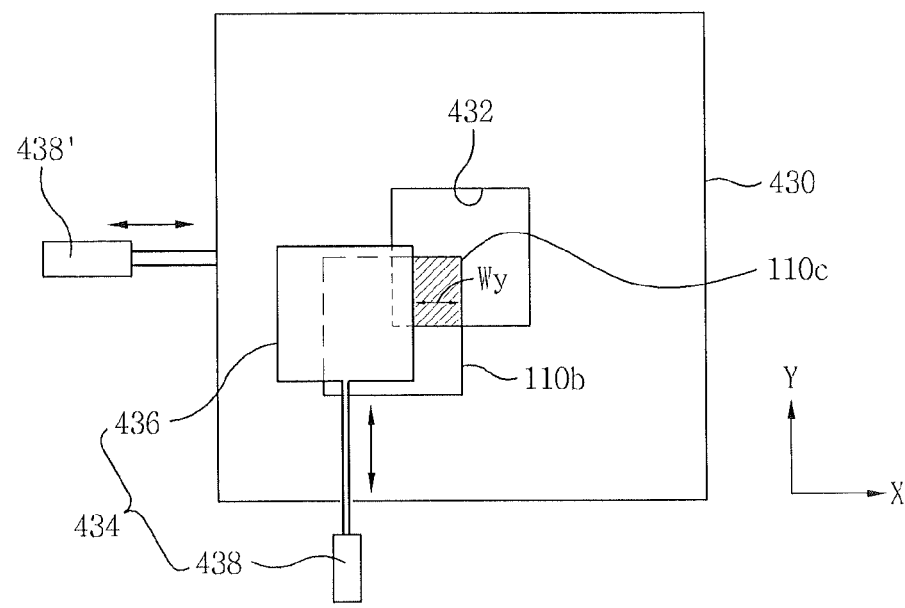
Figure 4E:
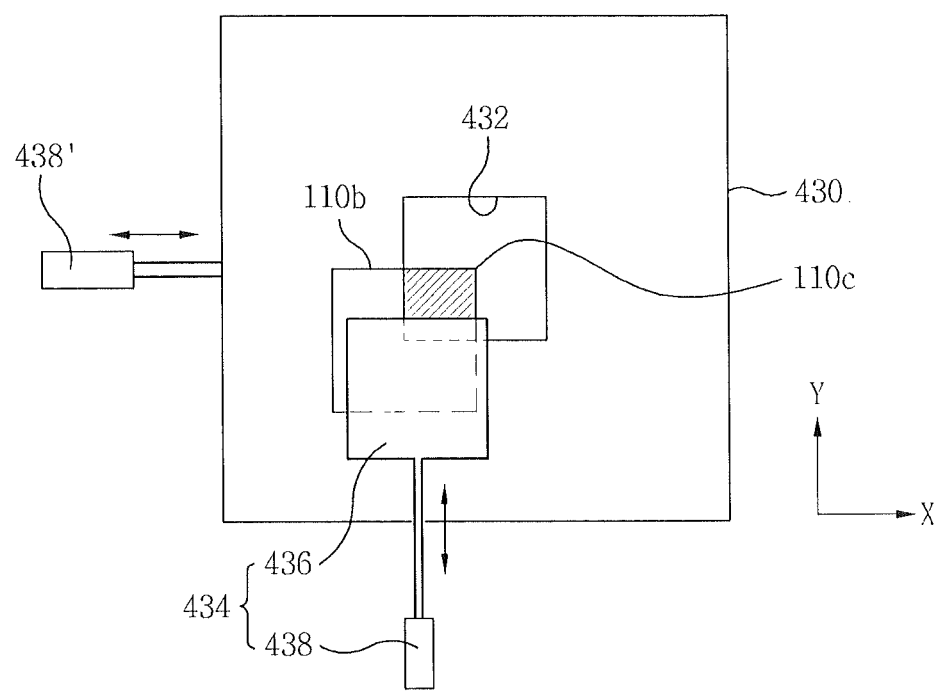

As illustrated by FIG. 4C, a first actuator 438 may be installed at one side of a shift screen 436. Accordingly, the shift screen 436 may move in a y-axial direction. Also, a second actuator 438' may be installed on a plate 430. The second actuator 438' may transfer the plate 430 in the x-axial direction. In this case, a formed opening may have an L shape having an irregular width Wx extending in an x-axial direction and an irregular width Wy extending in a y-axial direction. Thus, the first actuator 438 may drive the shift screen 436, and the second actuator 438' may drive the plate 430 so that the shift screen 436 can move in the x- and y-axial directions with respect to the second aperture 432. Moreover, as shown by FIG. 4D, when the shift screen 436 is transferred in the y-axial direction, a formed opening may have a rectangular shape extending in the y-axial direction. Meanwhile, referring to FIG. 4E, when the shift screen 436 is transferred in the x-axial direction, a formed opening may have a rectangular shape extending in the x-axial direction.

Figure 4F:
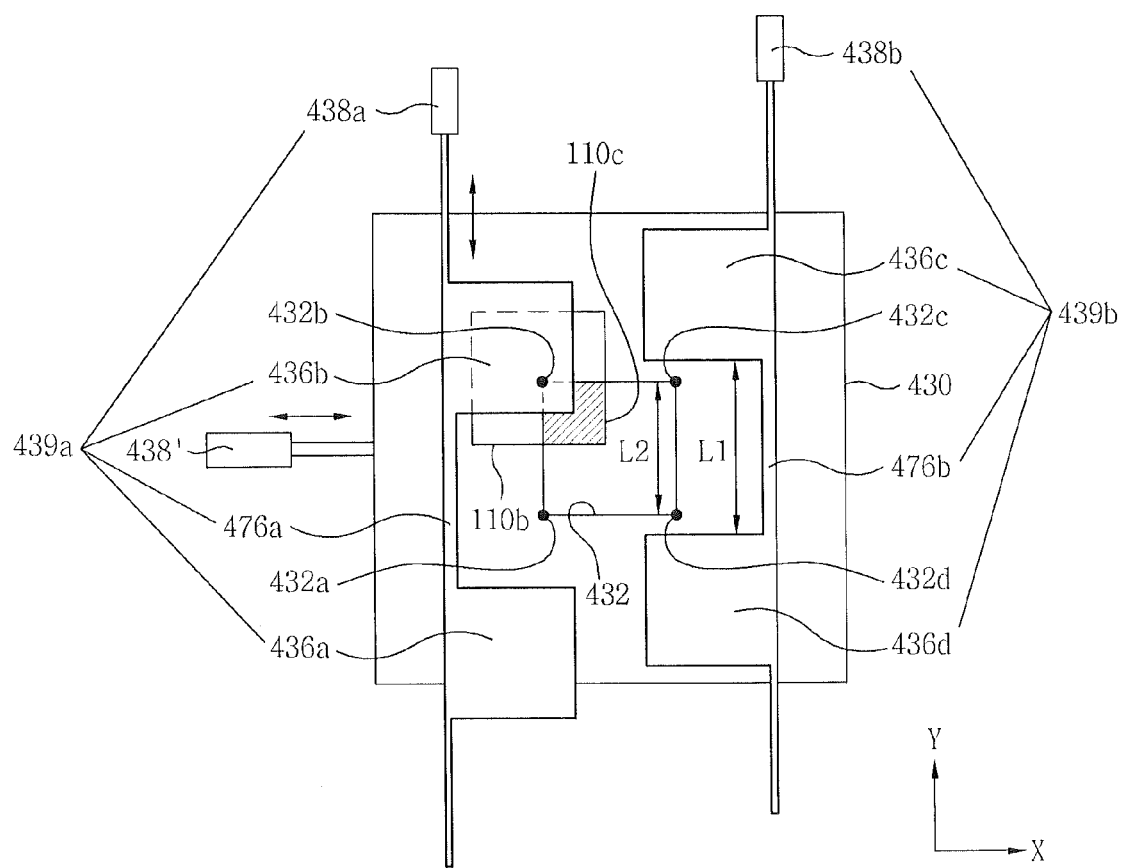

Referring to FIG. 4F, a first subsidiary beam shaper 439a may include a first screen 436a and a second screen 436b, which may be spaced apart from each other, and a first connector 476a configured to mechanically or physically connect the first and second screens 436a and 436b together. The first connector 476a may have a rod shape. Also, a first actuator 438a connected to at least one of the first and second screens 436a and 436b may be provided. The first screen 436a, the second screen 436b, and the first connector 476a may be connected as shown. A distance L1 between the first and second screens 436a and 436b may be greater than a length L2 of one side of the second aperture 432. Likewise, a second subsidiary beam shaper 439b may include a third screen 436c and a fourth screen 436d, which may be spaced apart from each other, and a second connector 476b configured to connect the third and fourth screens 436c and 436d. A second actuator 438b may be connected to at least one of the third and fourth screens 436c and 436d. The third screen 436c, the fourth screen 436d, and the second connector 476b may be integrally connected. A distance L1 between the third and fourth screens 436c and 436d may be greater than a length L2 of one side of the second aperture 432. The first subsidiary beam shaper 439a may move in a y-axial direction due to the first actuator 438a. In this case, the first actuator 438a may allow the first subsidiary beam shaper 439a to move such that one of the first and second screens 436a and 436b overlaps a portion of the second aperture 432. Also, when one of the first and second screens 436a and 436b of the first subsidiary beam shaper 439a partially overlaps the second aperture 432, the first connector 476a may not overlap the second aperture 432. For example, during an exposure process, the first connector 476a may connect the first and second screens 436a and 436b such that the first and second screens 436a and 436b do not overlap the second aperture 432 and are spaced apart from the second aperture 432.

In addition, the first and second subsidiary beam shapers 439b and 438a may be symmetrically disposed in a mirror-image relationship. The third screen 436c of the second subsidiary beam shaper 439b may be provided opposite the second screen 436b of the first subsidiary beam shaper 439a, while the fourth screen 436d of the second subsidiary beam shaper 439b may be provided opposite the first screen 436a of the first subsidiary beam shaper 439a. A distance between the second and third screens 436b and 436c may be less than the width of the second aperture 432. Also, a distance between the first and fourth screens 436a and 436d may be less than the width of the second aperture 432. A distance between the first and second connectors 476a and 476b may be greater than the width of the second aperture 432. Accordingly, the first and second connectors 476a and 476b may not overlap the second aperture 432 during an exposure process. Furthermore, an actuator 438' connected to a plate 430 may include a step motor, which means the plate 430 may move in the x- and y-axial directions using the step motor that drives in response to a signal of a controller.

Figure 5A:
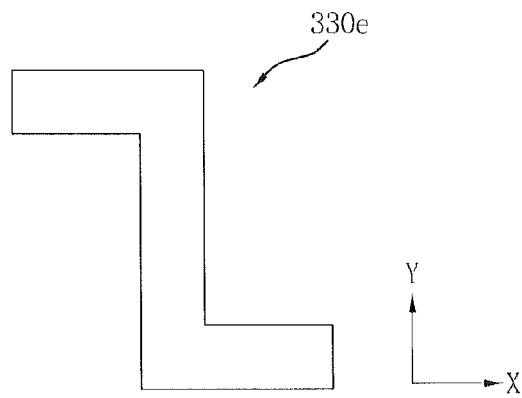
FIGS. 5A through 5C are plan views of various shapes of exposures within an exposure pattern according to embodiments of the inventive concept.
Figure 5B:
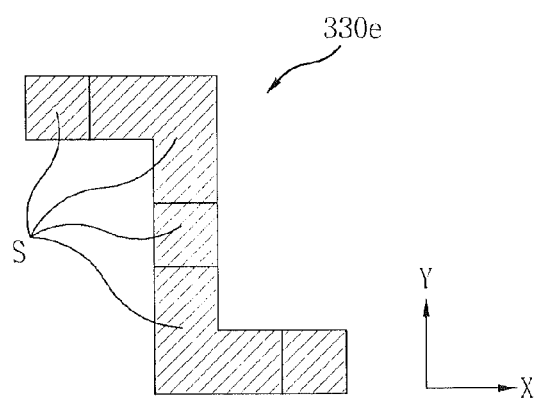
Figure 5C:
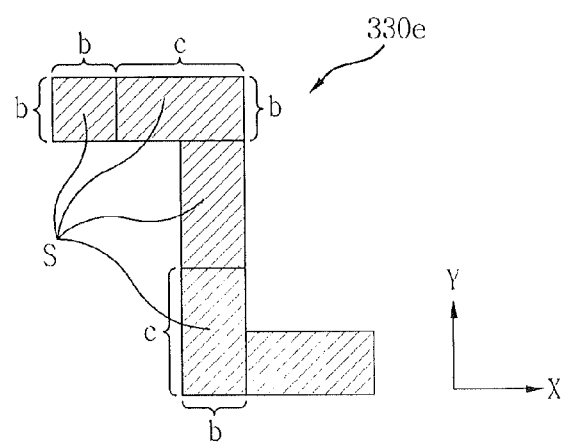

FIGS. 5A through 5C are plan views of various exposure shapes during formation of an exposure pattern according to embodiments of the inventive concept. Referring to FIGS. 5A through 5C, an exposure pattern 330e having a predetermined shape to be exposed may be divided into a plurality of smaller exposures S appropriate for a limited second shaped beam 110c. Specifically, referring to FIG. 5A, the desired exposure pattern 330e may elongate in an x-axial or y-axial direction. Referring to FIG. 5B, the desired exposure pattern 330e may be divided into smaller exposures having various square shapes or L shapes. According to the inventive concept, since the first shaped beam 110b has a tetragonal shape and crosses the exposure pattern 330e in an L shape, the second shaped beam 110c having an L shape may be formed in a region other than an exposure region, using the subsidiary beam shaper (refer to 434 in FIG. 1A) capable of cutting off the first shaped beam 110b. Thus, by use of the subsidiary beam shaper 434, at least two tetragonal exposures S of the exposure pattern 330e, which may cross each other at right angles in x- and y-axial directions, may be exposed as a single L-shaped pattern.

Moreover, because the subsidiary beam shaper (refer to 434 in FIG. 1B) includes a shift screen 436 having a predetermined area, a transformed pattern is not limited to a tetragonal or diamond shape but may be variously shaped into an L shape using the shift screen 436. Typically, a line-shaped exposure pattern 330e may be shaped as desired using a combination of a tetragonal shape and an L shape. Accordingly, the exposure pattern 330e may be formed using a combination of exposures having various shapes, such as an L shape, a + shape, or a T shape. Among these, a predetermined pattern may be formed using a combination of an L shape and a rectangular shape, thereby further facilitating design.

Referring to FIG. 5C, when the exposure pattern 330e is divided into smaller patterns having rectangular shapes with a size of a width (b)×a length (c) and exposed, the number of exposures S may be smaller than when the exposure pattern 330e is divided into patterns having regular tetragonal shapes with a size of a width (b)×a length (b) and exposed. Also, an end portion of the exposure pattern 330e may be divided into an exposure S having a regular tetragonal pattern with a size of b×b. When the exposure pattern 330e that may form one larger exposure S is divided into two or three smaller patterns as described above, exposure time may increase, and throughput may be reduced. In contrast, when the exposure pattern 330e that has been divided into two or three patterns is exposed at one time, exposure time may be reduced and throughput may increase.

By previously extracting information regarding the exposure pattern 330e during a design process and classifying the information into several types, the first and second beam shapers 410 and 430 and the subsidiary beam shaper 434 may be manipulated so that the exposure process may be easily performed using a reduced number of sequential beam exposures. For example, information may be previously classified into several types, such as a pattern having a regular tetragonal shape with a size of b×b, an L-shaped pattern having a covered corner and a size of c×c, or a pattern having a rectangular shape with a size of b×c. This information regarding the classified types may be stored and various exposure patterns 330e may be formed by combining the respective classified types.

Figure 6:
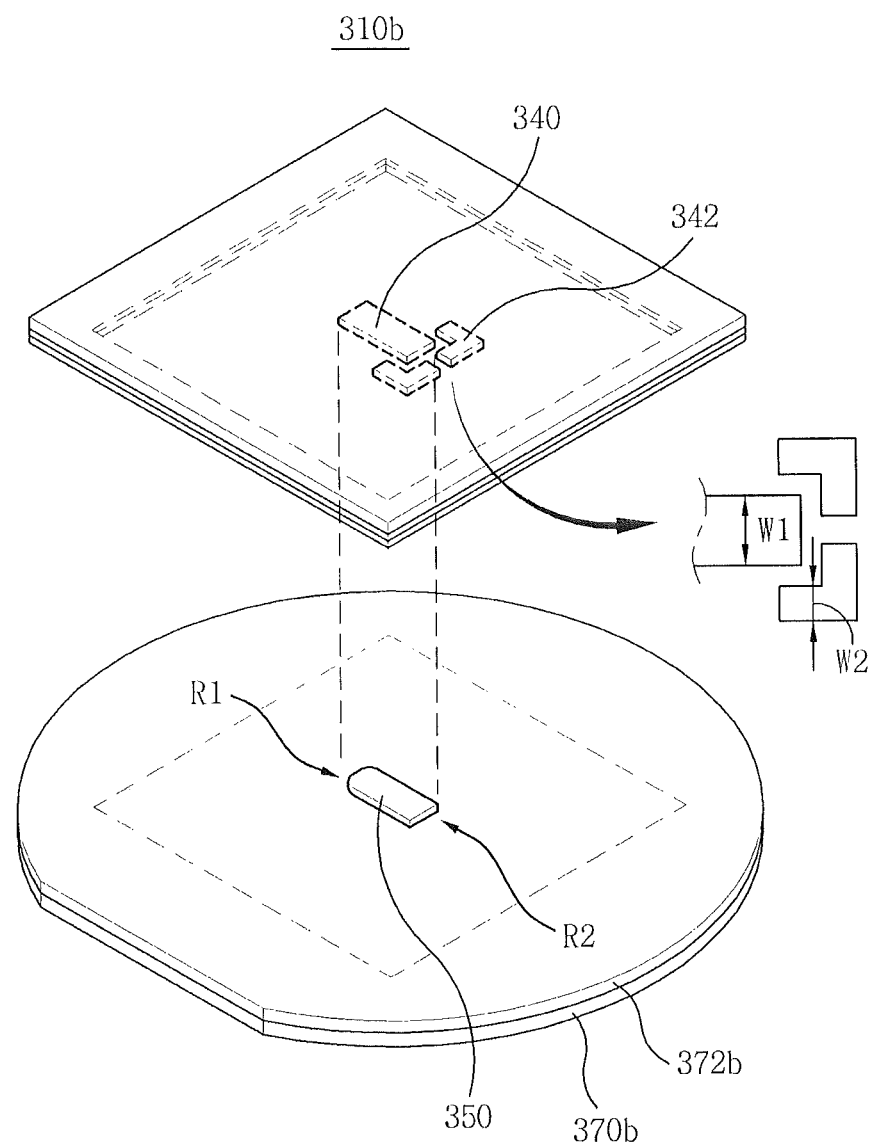
FIG. 6 is a perspective view of a construction for exposing a wafer using a photomask including an assist pattern according to an exemplary embodiment of the inventive concept.

FIG. 6 is a perspective view of a construction for exposing a wafer using a photomask including an assist pattern according to an exemplary embodiment of the inventive concept. Referring to FIG. 6, a photolithography process for manufacturing a semiconductor device using a main pattern 340 of a photomask 310b may include coating a second wafer photoresist layer 372b on a second wafer 370b, aligning the second wafer 370b with a photomask 310b, exposing the second wafer photoresist layer 372b using the photomask 310b formed as a predetermined layout, and forming a predetermined photoresist pattern 350 by developing the exposed second wafer photoresist layer 372b. When an exposure process is performed using the exposure system (refer to 100 in FIG. 1A) according to the inventive concept, the blank photomask (refer to 310a in FIG. 2A) may be manufactured as the photomask 310b including the main pattern 340. During the photolithography process for forming the photoresist pattern 350 on the second wafer 370b using the photomask 310b, when the photoresist pattern 350 is formed in a tetragonal or polygonal shape, a corner of the photoresist pattern 350 may be rounded due to diffraction of light. In this case, by forming an assist pattern 342 at a corner of the tetragonal main pattern 340 of the photomask 310b, an optical proximity effect (OPE) caused at a corner R2 of the photoresist pattern 350 of the second wafer 370b may be compensated. The assist pattern 342 of the photomask 310b may prevent reduction in the length of the photoresist pattern 350 of the second wafer 370b, or collapse of a corner (R2) of the photoresist pattern 350 thereof. The assist pattern 342 may have an L-shaped plane structure. When the assist pattern 342 has an L shape, exposing the assist pattern 342 due to a fundamental tetragonal exposure may be troublesome. In particular, this is because a width W2 of the assist pattern 342 is smaller than a width W1 of the main pattern 340. In one example, the L-shaped assist pattern 342 may be divided into an I-shaped pattern and a "-"-shaped pattern and exposed using multiple exposures. Accordingly, the L-shaped pattern may be exposed using at least two exposures. However, in the embodiment of the inventive concept, the assist beam shaper (refer to 434 in FIG. 1A) may be used to leave the remaining three corner regions to be exposed intact, and cut off the first shaped beam (refer to 110b in FIG. 1A) in the remaining one corner region.

Figure 7A:
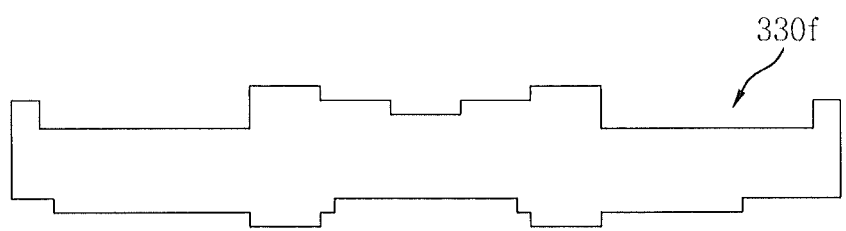
FIGS. 7A and 7B are plan views of various shapes of exposures of a pattern having irregular line widths according to embodiments of the inventive concept.
Figure 7B:
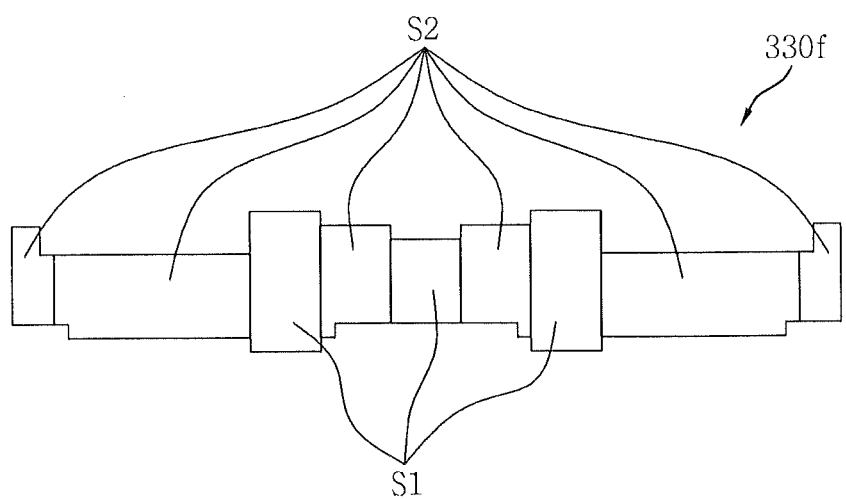

FIGS. 7A and 7B are plan views showing various exposure shapes during exposure of a pattern having irregular line widths according to an exemplary embodiment of the inventive concept. Referring to FIG. 7A, an exposure pattern 330f may not have a constant width. In particular, to compensate an OPE of a main pattern 340, the main pattern 340 may have an irregular width. Referring to FIG. 7B, when an exposure pattern 330 is divided into tetragonal exposures S1 and L-shaped exposures S2, the total number of sequential exposures may become smaller than when the exposure pattern 330 is divided into only tetragonal exposures. Thus, when one big exposure pattern 330f is formed, it may be divided into a plurality of unit patterns and split into a plurality of exposures S1 and S2 to enable an exposure operation. In this case, when an exposure pattern 330' includes a combination of tetragonal patterns and L-shaped patterns, the number of times an exposure operation is performed may be less than when an exposure pattern includes only tetragonal patterns.

Figure 8A:
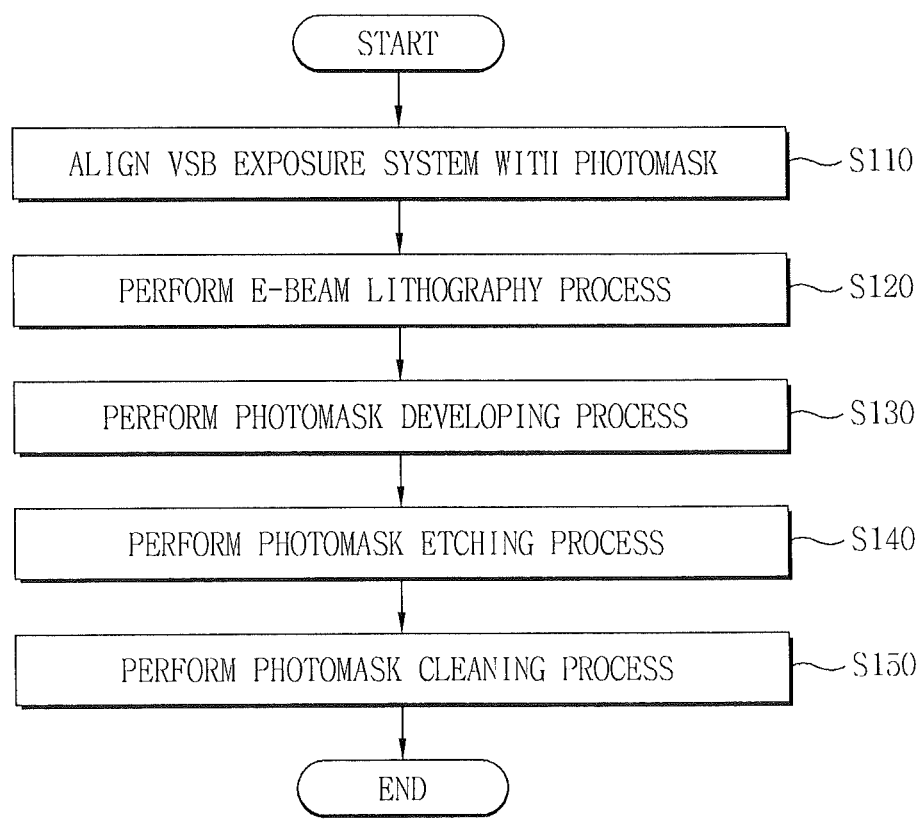
FIG. 8A is a flowchart illustrating an e-beam lithography process according to an exemplary embodiment of the inventive concept.

FIG. 8A is a flowchart illustrating an e-beam lithography process according to an exemplary embodiment of the inventive concept. FIGS. 8B through 8G are cross-sectional views illustrating a process of manufacturing a photomask using an exposure system according to an exemplary embodiment of the inventive concept. FIG. 8H is a plan view of a photomask manufactured using the process described with reference to FIGS. 8B through 8G Referring to FIG. 8A, an e-beam lithography process for forming a photomask using a blank photomask may include, in sequence, aligning a VSB exposure system with a photomask (S110), performing an e-beam lithography process (S120), performing a photomask developing process (S130), performing a photomask etching process (S140), and performing a photomask cleaning process (S150). For example, when e-beams are selectively incident to a polymer-based photoresist layer 318 formed on the blank photomask (refer to 310a in FIG. 2A), an exposure pattern 330a may be formed using a developing process. For instance, a difference in polymer state may occur between a portion of the photoresist layer 318 irradiated with the e-beams and a portion of the photoresist layer 318 to which e-beams are blocked from irradiation, and the desired exposure pattern 330a may be formed while exposing the photoresist layer 318 to a developing solution. A light shielding layer 316 may be patterned using the exposure pattern 330a as an etch mask, and a shift layer 314 may be patterned using the patterned light shielding layer 316 as a hard mask, thereby forming a main pattern (refer to 340 in FIG. 6) and an assist pattern 342 on the photomask 310b. A semiconductor pattern 350 corresponding to the main pattern 340 may be formed on a second wafer (refer to 370b in FIG. 6) using the photomask 310b. Meanwhile, although FIG. 2A illustrates a process of patterning the photoresist layer 318 formed on the blank photomask 310a using e-beam writing to manufacture the photomask 310b, as shown in FIG. 2B, e-beam writing may be applied likewise to a process of patterning a photoresist layer 372a formed on a wafer 370a to manufacture a semiconductor device.

Referring back to FIG. 1A, a photoresist substrate 310, for example, a blank photomask (refer to 310a in FIG. 2A), may be mounted on a substrate stage 360. When a light shaping unit 400 is aligned with the blank photomask 310a, e-beam writing may be performed. A source beam 110a emitted by a beam generator 200 may be focused by a condenser lens 460 on a first beam shaper 410 and shaped into a first shaped beam 110b having a tetragonal shape by the first beam shaper 410. The first shaped beam 110b may be irradiated to a second aperture 432 of a second beam shaper 435 and a subsidiary beam shaper 434 by a first deflector 420. In this case, the first deflector 420 may control the direction in which the first shape beam 110b travels, thereby controlling the position and size of the first shaped beam 110b overlapped with the second aperture 432. For example, the first shaped beam 110b may be shifted by the first deflector 420 in x- and y-axial directions. A second shaped beam 110c may be shrunk by an object deflector 450 and deflected again by a second deflector 440. The reduced-size second shaped beam 110c may be irradiated by the second deflector 440 to a base 310, that is, the blank photomask 310a.

Figure 8B:
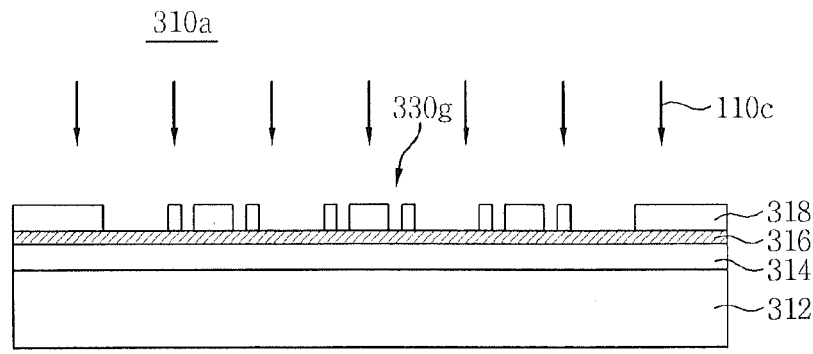
FIGS. 8B through 8G are longitudinal sectional views illustrating a process of manufacturing a photomask using an exposure system according to an exemplary embodiment of the inventive concept.

Referring to FIG. 8B, a developing process may be performed on an exposed photoresist layer 318 using e-beams, for example, the second shaped beams 110c. Thus, an exposure pattern 330g may be formed to selectively strip only a portion of a pattern area P. The exposure pattern 330g may be formed as the type of a plurality of holes to form a contact, or as the type of lines and spaces to form an interconnection line.

Figure 8C:
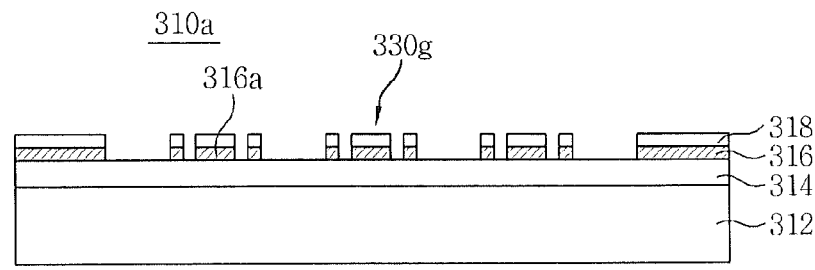
Figure 8D:
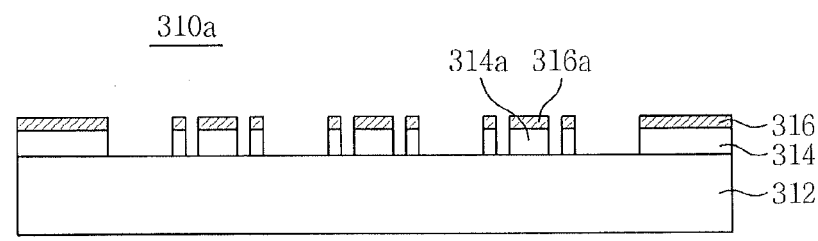

Referring to FIG. 8C, a light shielding layer 316 may be dry etched using the exposure pattern 330g as an etch mask. Thus, a light shielding pattern 316a may be formed to selectively expose a shift layer 314. The exposure pattern 330g may be stripped and cleaned. Referring to FIG. 8D, the shift layer 314 may be etched using the light shielding pattern 316a as a hard mask. Thus, a shift pattern 314a may be formed. Similar to the exposure pattern (refer to 330g in FIG. 8B), the shift pattern 314a may be formed as a predetermined contact pattern or interconnection pattern.

Figure 8E:
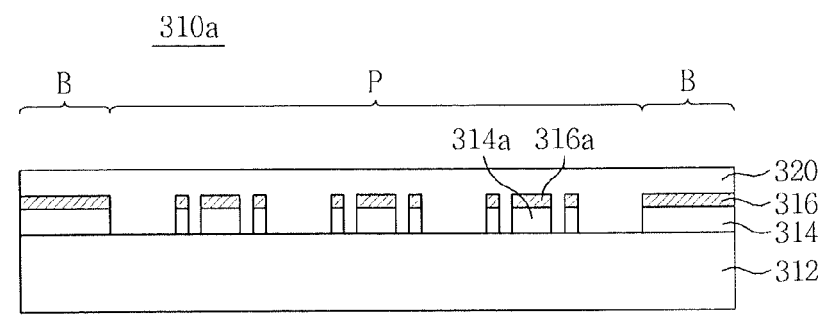
Figure 8F:
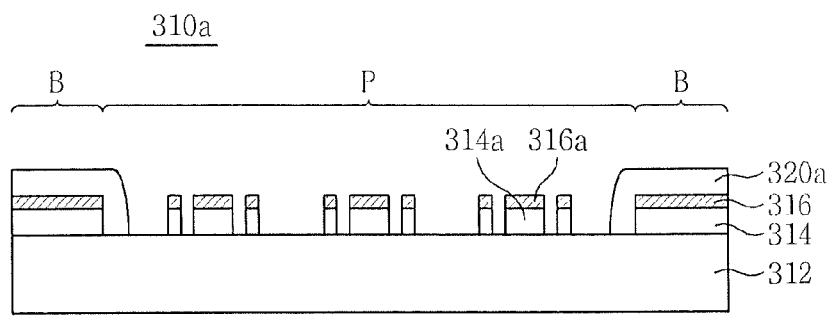

Referring to FIG. 8E, a mask layer 320 may be formed on the pattern area P and a blind area B. The mask layer 320 may include a photoresist layer. Referring to FIG. 8F, a pattern-area opening mask 320a for opening the pattern area P may be formed only on the blind area B. In this case, when the pattern-area opening mask 320a includes a photoresist layer, exposure and developing processes may be performed. However, since the entire pattern area P is exposed, a photolithography process may be performed instead of an e-beam lithography process.

Figure 8G:
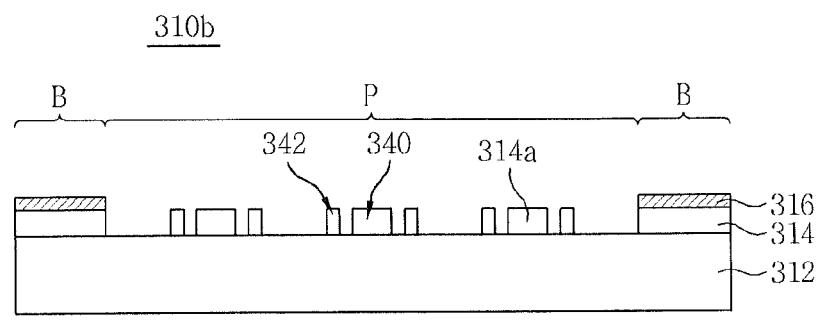
Figure 8H:
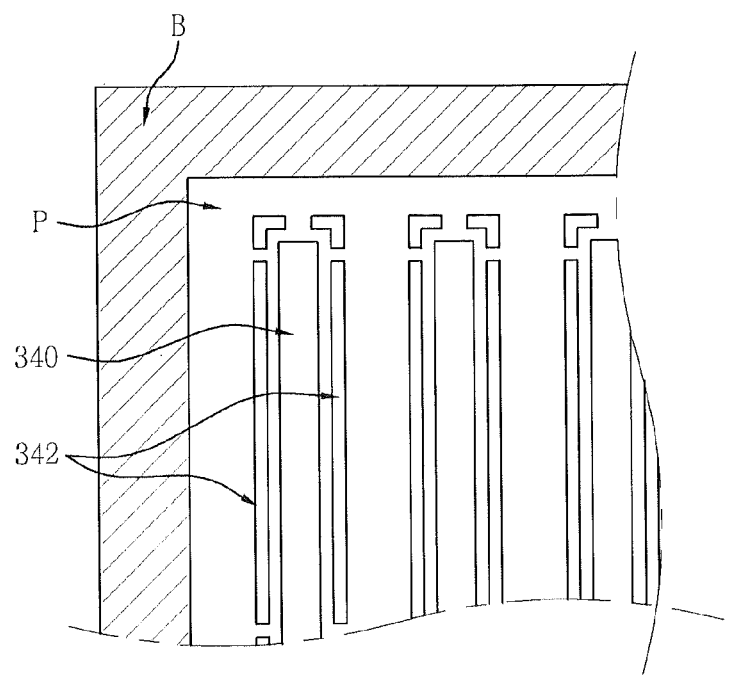
FIG. 8H is a plan view of a photomask manufactured using the process described with reference to FIGS. 8B through 8G.

Referring to FIG. 8G, an etching process may be performed using the pattern-area opening mask 320a as an etch mask, thereby stripping the light shielding pattern (refer to 316a in FIG. 8D) from the pattern area P. Thereafter, the pattern-area opening mask (refer to 320a in FIG. 8F) may be stripped. The light shielding layer 316 may remain intact on the blind area B and prevent transmission of light at a transmission rate of 0% in the vicinity of the photomask 310b during a photolithography process. From a longitudinal sectional view, the photomask 310b may include a transparent substrate 312 configured to allow transmission of the second shaped beam 110c, the light shielding layer 316 configured to shield the second shaped beam 110c, and the shift pattern 314a configured to allow transmission of the second shaped beam 110c at a predetermined transmission rate.

Referring to FIG. 8H, from a plan view, the photomask 310b may include the pattern area P disposed in the center thereof, and a blind area B disposed in the vicinity thereof. The pattern area P may include the main pattern 340, such as a circuit pattern (e.g., a contact pattern or interconnection pattern) to be transferred to a wafer. Also, the pattern area P may further include the assist pattern 342 to reduce density deviation of the main pattern 340 and increase the resolution of the main pattern 340. The assist pattern 342 may function as a sub-resolution assist feature (SRAF) to compensate an OPE as described above with reference to FIG. 6.

To increase integration density of semiconductor devices, design rules are decreasing, and the formation of the main patterns 340 and the assist pattern 342 are being significantly considered during an exposure process. For example, since a critical dimension (CD) line width of the assist pattern 342 may be less than a CD line width of the main pattern 340, and the assist pattern 342 is formed in various shapes including an L shape, increasing the resolution of the assist pattern 342 may be more difficult. Accordingly, the formation of the assist pattern 342 may be required to reduce density deviation due to an OPE, and prevent the rounding of a corner region. Therefore, fundamental exposures need to be combined with several modified exposures to enable appropriate exposure of the assist pattern 342.

Figure 9A:
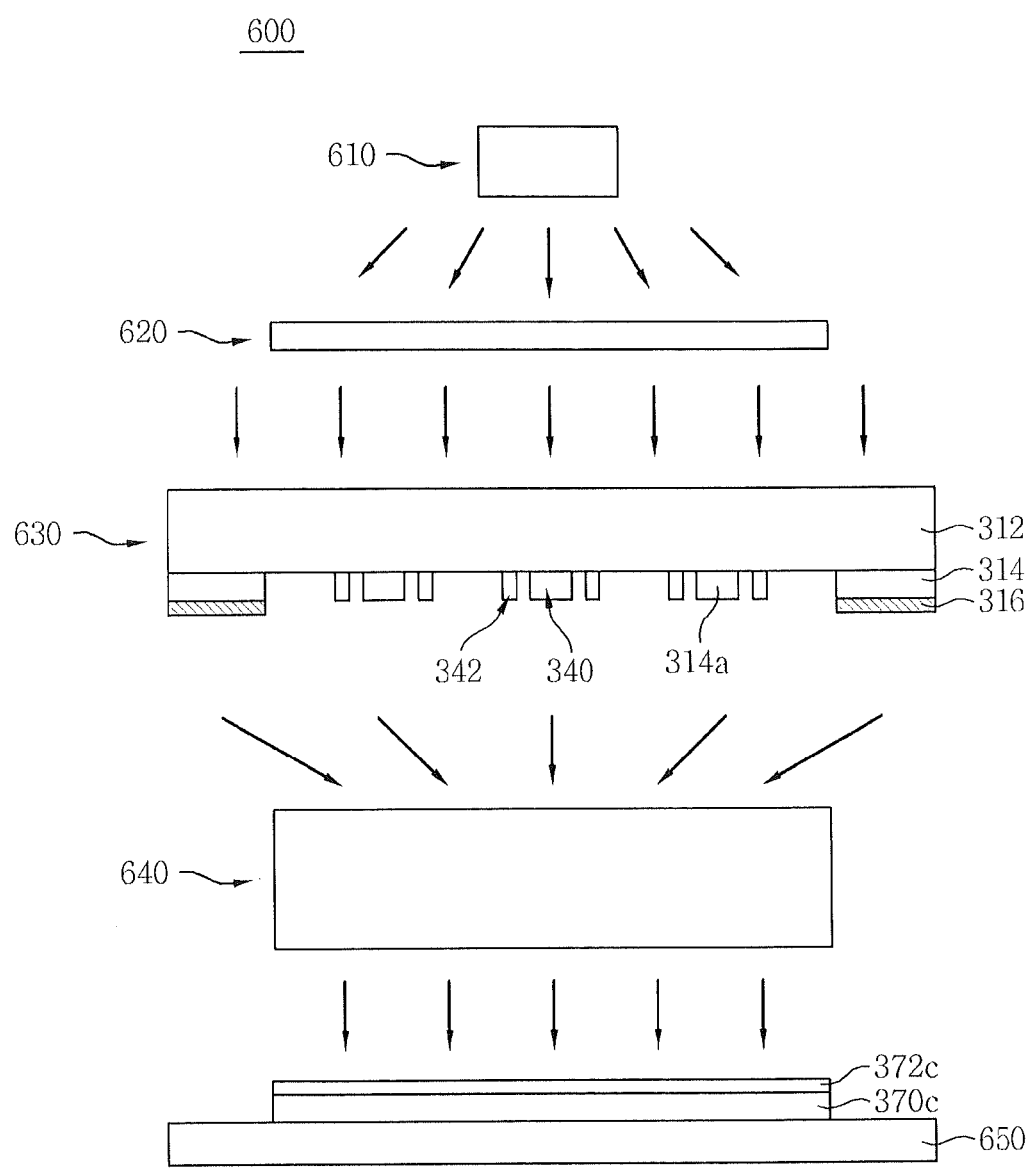
FIG. 9A is a cross-sectional view of a photolithography apparatus according to embodiments of the inventive concept.
Figure 9B:
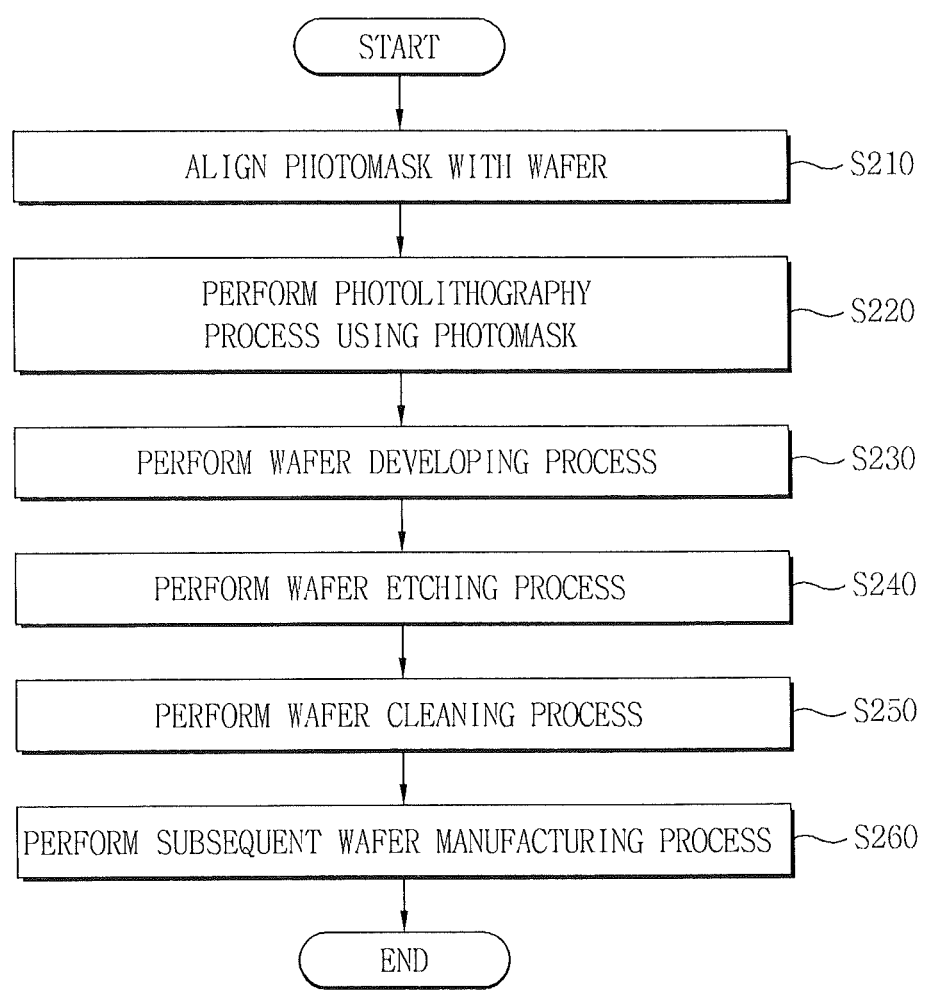
FIG. 9B is a flowchart illustrating a process of manufacturing a wafer using the photolithography apparatus of FIG. 9A.

FIG. 9A is a cross-sectional view of a photolithography apparatus according to an exemplary embodiment of the inventive concept, and FIG. 9B is a flowchart illustrating a process of manufacturing a wafer using the photolithography apparatus of FIG. 9A. Referring to FIG. 9A, a photolithography apparatus 600 may include a second beam generator 610, a second condenser lens 620, a photomask 630, a projection lens 640, and a wafer stage 650. The second beam generator 610 may use UV light having a very short wavelength, such as i-line, KrF, or ArF. The second condenser lens 620 may prevent UV light from departing from a travel path. The photomask 630 may be manufactured using the photomask manufacturing process described with reference to FIGS. 8B through 8G, and include a main pattern 340. The projection lens 640 may transfer the main pattern 340 to the wafer stage 650. The wafer stage 650 on which a wafer 370c is mounted may move upward, downward, forward, backward, leftward, and rightward. A photoresist layer 372c may be coated on the surface of the wafer 370c.

Referring to FIGS. 9A and 9B, a method of manufacturing a semiconductor device using a photomask may include aligning a photomask 630 with a wafer stage 650 (S210), performing a photolithography process 220 using the photomask 630 (S220), performing a wafer developing process (S230), performing a wafer etching process (S240), performing a wafer cleaning process (S250), and performing a subsequent wafer manufacturing process (S260). Before aligning the photomask 630 with the wafer stage 650, a wafer 370c may be introduced on the wafer stage 650. A photolithography process may be performed using the photomask 630. For example, ultraviolet (UV) light may be irradiated from the second beam generator 610 to the photomask 630. Since the main pattern 340 and the assist pattern 342 are formed on the photomask 630, the UV light may be selectively irradiated to the wafer 370c so that the main pattern 340 can be transferred onto the wafer 370c. However, the assist pattern 342, which may prevent occurrence of an OPE, may not be directly irradiated to the wafer 370c. That is, the main pattern 340 may shrink and be transferred to a photoresist layer 372c formed on the surface of the wafer 370c. A developing process may be performed. For example, the photoresist layer 372c disposed on the surface of the wafer 370c may be patterned using a chemical technique to form a photoresist pattern. An etching process may be performed. The wafer 370c may be patterned using the photoresist pattern as an etch mask. Alternatively, a material layer may be further included between the wafer 370c and the photoresist layer 372c and patterned. A cleaning process may be performed. The photoresist pattern may be stripped, and the wafer 370c may be cleaned. After the above-described wafer manufacturing process is finished, a subsequent wafer manufacturing process may be performed. For example, the subsequent wafer manufacturing process may include a package manufacturing process for assembling wafers manufactured using the above-described method.

In addition, the names and functions of unshown or undescribed components may be easily understood with reference to other drawings of the present specification and descriptions thereof. As described thus far, an exposure system according to the inventive concept may have the following effects. First, according to an e-beam lithography method for emitting VSBs by overlapping a pair of apertures, the size of exposures may be freely controlled according to the extent to which the apertures overlap, but the shape of exposures cannot be freely obtained. However, since a shift screen according to the inventive concept may enable formation of exposures in various desired shapes, VSBs may be obtained more diversely. Second, even if a photomask pattern has an irregular line width, since exposures are not limited to tetragonal shapes, a desired pattern may be formed without limitation using a combination of several types of exposures. Unlike a main pattern of a photomask, an assist pattern may have an irregular line width or a relatively small width without specific limitation of shapes. Accordingly, a VSB exposure system using a shift screen according to the inventive concept may adaptively cope with formation of the irregular assist pattern. In particular, since the pattern may be freely formed using a combination of only two shapes (i.e., a regular tetragonal shape and an L shape) or a combination of only three shapes (i.e., a regular tetragonal shape, an L shape, and a rectangular shape), the formation of the pattern may be easily controlled. Third, even if a CD line width is reduced, division of exposures may be unnecessary, and a shift screen may effectively cope with a fine line width. Accordingly, the number of times an exposure operation is performed may be reduced by at least half, and throughput may be increased by at least twice the amount. Fourth, since the shift screen is installed on a top or bottom surface of a second beam shaper and driven on the same operation principle as the second beam shaper, an additional space and apparatus may not be required, and the shift screen may be simply controlled.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An exposure system for integrated circuit fabrication, comprising:
   a beam generator configured to irradiate source beams in a direction of an object to be exposed by the source beams;
   a first beam shaper disposed proximate said beam generator, said first beam shaper having a first aperture therein positioned to pass through the source beams received from said beam generator; and a second beam shaper disposed proximate said first beam shaper, said second beam shaper comprising:
   a plate having a second aperture therein positioned to receive the source beams passed through the first aperture of said first beam shaper;
   a first actuator;
   a first shift screen mechanically coupled to the first actuator, said first shift screen configured to at least partially block the second aperture from receiving the source beams from said first beam shaper in response to movement of the first actuator; and
   a second actuator mechanically coupled to the plate, said second actuator configured to move the plate in a direction orthogonal to the movement of the first actuator.

2. The exposure system of claim 1, wherein the second aperture has a rectangular shape; and wherein the first shift screen is configured to move back and forth along a line parallel to a diagonal of the second aperture, in response to back and forth movement of the first actuator.

3. The exposure system of claim 2, wherein the first shift screen has a polygonal shape with at least one right-angled corner.

4. The exposure system of claim 1, further comprising a second polygonal-shaped shift screen mechanically coupled to the first shift screen.

5. An exposure system for integrated circuit fabrication, comprising:
   a beam generator configured to irradiate source beams in a direction of an object to be exposed by the source beams;
   a first beam shaper disposed proximate said beam generator, said first beam shaper having a first aperture therein positioned to pass through the source beams received from said beam generator; and
   a second beam shaper disposed proximate said first beam shaper, said second beam shaper comprising:
      a plate having a second aperture therein positioned to receive the source beams passed through the first aperture of said first beam shaper;
      a first actuator;
      a first shift screen mechanically coupled to the first actuator, said first shift screen having a polygonal shape with at least one right-angled corner and configured to at least partially block the second aperture from receiving the source beams from said first beam shaper in response to movement of the first actuator; and
      a second polygonal-shaped shift screen mechanically coupled to the first shift screen;
   wherein movement of the first actuator in a first direction causes the first shift screen to move in the first direction towards the second aperture and the second shift screen to move in the first direction away from the second aperture.

6. An exposure system comprising:
   a beam generator configured to irradiate source beams;
   a first beam shaper provided under the beam generator and having a first aperture; and
   a second beam shaper provided under the first beam shaper;
   wherein the second beam shaper comprises:
      a plate having a second aperture;
      a shift screen configured to partially cover the second aperture; and
      a first actuator configured to move the shift screen; and
      wherein the second aperture is covered with the shift screen and shaped into an L shape.

7. The system of claim 6, wherein the shift screen is transferred by the first actuator in a horizontal direction.

8. The system of claim 6, further comprising a second actuator connected to the plate.

9. An exposure system comprising:
   a beam generator configured to irradiate source beams;
   a first beam shaper provided under the beam generator and having a first aperture; and
   a second beam shaper provided under the first beam shaper;
   wherein the second beam shaper comprises:
      a plate having a second aperture;
      a shift screen configured to partially cover the second aperture;
      a first actuator configured to move the shift screen; and
      a second actuator connected to the plate;
   wherein the first actuator transfers the shift screen in a first horizontal direction, and the second actuator transfers the plate in a second horizontal direction perpendicular to the first horizontal direction.

10. The system of claim 9, wherein the second aperture has first and second corners, and the shift screen includes a first screen and a second screen corresponding respectively to the first and second corners of the second aperture, wherein the first and second corners of the second aperture are right-angle corner.

11. The system of claim 10, wherein the first and second screens are connected by a first connector.

12. The system of claim 11, wherein a distance between the first and second screens is greater than a distance between the first and second corners of the second aperture.

13. The system of claim 11, wherein the second aperture further comprises a third corner and a fourth corner, and the shift screen includes a third screen and a fourth screen corresponding respectively to the third and fourth corners of the second aperture.

14. The system of claim 13, wherein the third and fourth screens are connected by a second connector, and the first and second connectors are parallel.

15. The system of claim 9, wherein the second aperture has a tetragonal shape having four right-angled corners, and the shift screen includes four screens corresponding respectively to the four right-angled corners.

* * * * *